(12) United States Patent
Shin

(10) Patent No.: US 9,325,314 B2
(45) Date of Patent: Apr. 26, 2016

(54) INTEGRATED CIRCUIT INCLUDING CIRCUITS DRIVEN IN DIFFERENT VOLTAGE DOMAINS

(71) Applicant: SAMSUNG ELECTRONICS CO., LTD., Suwon-si (KR)

(72) Inventor: Ken Keon Shin, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 2 days.

(21) Appl. No.: 14/100,114

(22) Filed: Dec. 9, 2013

(65) Prior Publication Data

US 2014/0159773 A1 Jun. 12, 2014

Related U.S. Application Data

(60) Provisional application No. 61/734,621, filed on Dec. 7, 2012.

(30) Foreign Application Priority Data

Mar. 15, 2013 (KR) .................. 10-2013-0028313

(51) Int. Cl.
*H03K 19/0175* (2006.01)
*H03K 19/00* (2006.01)
*G11C 5/14* (2006.01)

(52) U.S. Cl.
CPC ............ *H03K 19/0175* (2013.01); *G11C 5/147* (2013.01); *H03K 19/0016* (2013.01)

(58) Field of Classification Search
CPC ..... G11C 8/10; G11C 7/12; H03K 19/018521

USPC .......................... 326/63, 68, 80–81; 327/333; 365/189.08, 189.11, 230.06
See application file for complete search history.

(56) References Cited

U.S. PATENT DOCUMENTS

| 7,864,597 | B2 | 1/2011 | Worley et al. |
| 7,885,125 | B2 | 2/2011 | Hirabayashi |
| 7,952,937 | B2 | 5/2011 | Bode |
| 8,098,534 | B2 * | 1/2012 | Campbell ............ G11C 5/143 365/189.08 |
| 8,164,971 | B2 | 4/2012 | Wang et al. |

(Continued)

OTHER PUBLICATIONS

Chen, et al., "A 0.6 V Dual-Rail Compiler SRAM Design on 45 nm CMOS Technology With Adaptive SRAM Power for Lower $VDD\_min$ VLSIs", IEEE Journal of Solid-State Circuits, Vol. 44, No. 4, Apr. 2009, pp. 1209-1215.

*Primary Examiner* — Jason M Crawford

(74) *Attorney, Agent, or Firm* — Sughrue Mion, PLLC

(57) ABSTRACT

Provided is an integrated circuit including circuits driven in different voltage domains. The integrated circuit includes a logic circuit configured to be driven by a first power supply voltage having a first power supply voltage level, and a memory circuit configured to be driven by a second power supply voltage having a second power supply voltage level different from the first power supply voltage level. The memory circuit includes a circuit configured to interface with the logic circuit, configured to be supplied with power at the second power supply voltage level in response to an output signal, and configured to shift a level of a signal having the first power supply voltage level received from the logic circuit to the second power supply voltage level. The first power supply voltage corresponds to a first voltage domain, and the second power supply voltage corresponds to a second voltage domain.

24 Claims, 8 Drawing Sheets

(56) References Cited

U.S. PATENT DOCUMENTS

| | | |
|---|---|---|
| 2010/0165754 A1 | 7/2010 | Gupta et al. |
| 2010/0302880 A1* | 12/2010 | Wang .................. G11C 11/417 365/189.11 |
| 2010/0329062 A1* | 12/2010 | Campbell ................ G11C 7/04 365/226 |
| 2011/0058439 A1 | 3/2011 | Lee et al. |
| 2011/0188326 A1 | 8/2011 | Lee et al. |
| 2011/0194362 A1 | 8/2011 | Lu et al. |
| 2012/0020146 A1 | 1/2012 | Jung et al. |
| 2012/0134221 A1 | 5/2012 | Arsovski et al. |
| 2012/0188816 A1 | 7/2012 | Kim et al. |
| 2012/0294095 A1* | 11/2012 | Shiu ..................... G11C 7/1057 365/189.11 |

\* cited by examiner

US 9,325,314 B2

INTEGRATED CIRCUIT INCLUDING CIRCUITS DRIVEN IN DIFFERENT VOLTAGE DOMAINS

CROSS-REFERENCE TO RELATED APPLICATIONS

This application claims the benefit of U.S. Provisional Patent Application No. 61/734,621, filed on Dec. 7, 2012, in the U.S. Patent and Trademark Office and Korean Patent Application No. 10-2013-0028313, filed on Mar. 15, 2013, in the Korean Intellectual Property Office, the disclosures of which are incorporated herein in their entirety by reference.

BACKGROUND

1. Field

Exemplary embodiments relate to an integrated circuit, and more particularly, to an integrated circuit including circuits that are driven in different voltage domains.

2. Description of the Related Art

Power consumption of an integrated circuit relates to a power supply voltage applied to the integrated circuit. Power consumed by an integrated circuit depends on a level of a power supply voltage with respect to a ground voltage. In general, power consumption may be reduced by reducing a level of a power supply voltage. However, there is a limitation in reducing a level of a power supply voltage. For example, when a power supply voltage is reduced to a level equal to or lower than a specific voltage, the robustness of a memory device, such as a static random-access memory (SRAM), included in an integrated circuit may be reduced and the read and/or write performance of the memory device may be degraded. Accordingly, there is a demand for an integrated circuit which may guarantee, even when a level of a power supply voltage of the integrated circuit is set to be lower than a level of an operating voltage of a memory device in order to reduce power consumption, the performance of the memory device.

SUMMARY

Exemplary embodiments provide an integrated circuit including circuits that are driven in different voltage domains.

According to an aspect of an exemplary embodiment, there is provided an integrated circuit including: a first circuit area that is driven by a first power supply voltage; and a second circuit area that is driven by a second power supply voltage different from the first power supply voltage, the integrated circuit including an interface circuit configured to receive at least one signal from the first circuit area, wherein the interface circuit is configured to be supplied with power at a second power supply voltage level in response to an output signal of the second circuit area, and generates the output signal of the second circuit area, the output signal having a level which is shifted to the second power supply voltage level.

According to another aspect of an exemplary embodiment, there is provided an interface circuit connected between first and second voltage domains, the interface circuit including: a first PMOS transistor that is connected to a second power supply voltage different from a first power supply voltage, and is configured to be controlled by an output signal; a second PMOS transistor that is connected between the first PMOS transistor and a first node, and is configured to be controlled by an input signal of a first power supply voltage level; a third PMOS transistor that is connected to the second power supply voltage, and is configured to be controlled by a clock signal; first and second NMOS transistors that are serially connected between the first node and a ground voltage, and are respectively configured to be controlled by the input signal and the clock signal; and an inverter that is connected to the first node, and is configured to output the output signal according to a signal of the first node, wherein the first power supply voltage corresponds to the first voltage domain, and the second power supply voltage corresponds to the second voltage domain.

According to another aspect of an exemplary embodiment, there is provided an integrated circuit including: a logic circuit configured to be driven by a first power supply voltage having a first power supply voltage level; and a memory circuit configured to be driven by a second power supply voltage having a second power supply voltage level different from the first power supply voltage level, the memory circuit including a circuit configured to interface with the logic circuit, wherein the circuit is configured to be supplied with power at the second power supply voltage level in response to an output signal thereof, and configured to shift a level of a signal having the first power supply voltage level received from the logic circuit to the second power supply voltage level.

According to another aspect of an exemplary embodiment, there is provided an operation method including: driving a first circuit area with a first power supply voltage; driving a second circuit area with a second power supply voltage different from the first power supply voltage; generating a signal having a first power supply voltage level in the first circuit area; and shifting a level of the signal in response to a signal in the second circuit area, and generating an output signal of a second power supply voltage level, wherein the second circuit area is supplied with power at the second power supply voltage level in response to the output signal.

According to another aspect of an exemplary embodiment, there is provided a decoder including a logic gate configured to decode a plurality of first input signals having a first power supply voltage level and generate a first output signal at an output node, the first output signal having a second power supply voltage level different from the first power supply voltage level; and an inverter configured to invert the first output signal and generate a second output signal at the second power supply voltage level, wherein the decoder is configured to receive a first clock signal configured to control precharging the output node at a first logic level of the first clock signal and evaluate the output node at a second logic level of the first clock signal, and wherein the second output signal is received at the logic gate.

According to another aspect of an exemplary embodiment, there is provided a memory including an address decoder configured to decode a plurality of address input signals at a first power supply voltage level and generate a first address decoding signal at an output node at a second power supply voltage level different from the first power supply voltage level; and an inverter configured to invert the first address decoding signal and generate a second address decoding signal at the second power supply voltage level, wherein the memory is configured to receive a first clock signal configured to control precharging the output node at a first phase of the first clock signal and evaluate the output node at a second phase of the first clock signal, and wherein the second address decoding signal is received at a logic gate.

According to another aspect of an exemplary embodiment, there is provided a method of processing data by an integrated circuit including a logic circuit and a memory circuit, the method including generating, by the logic circuit, control signals having a first power supply voltage level which are used to control the memory circuit, and transmitting the control signals to the memory circuit; shifting, by the memory circuit, levels of the controls signals to a second power supply voltage level which is different from the first power supply voltage level; and performing, by the memory circuit, read or write operations according to the control signals having the shifted levels.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXEMPLARY EMBODIMENTS

Figure 1:
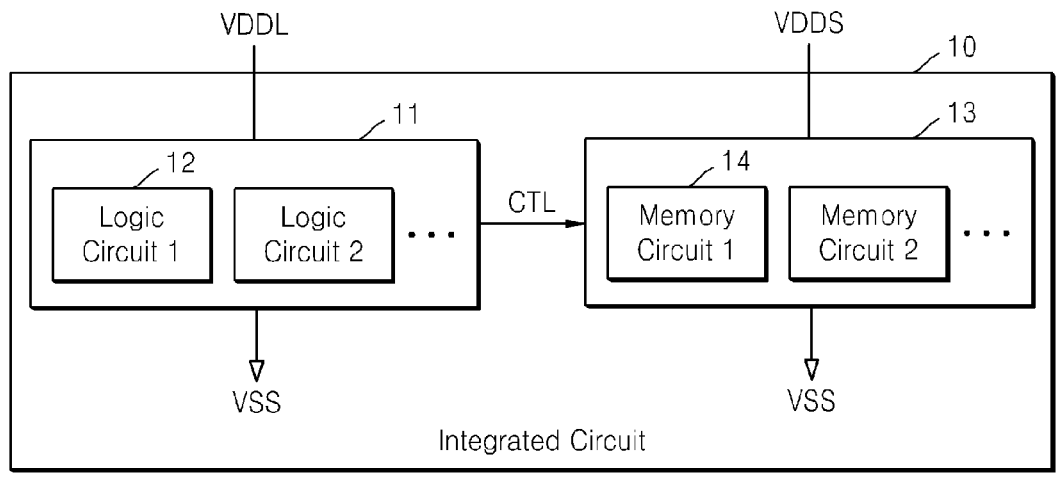
FIG. 1 is a block diagram illustrating an integrated circuit according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The advantages and features of the exemplary embodiments and methods of achieving the advantages and features will be described more fully with reference to the accompanying drawings, in which exemplary embodiments are shown.

Hereinafter, the exemplary embodiments will be described more fully with reference to the accompanying drawings, in which exemplary embodiments are shown. The exemplary embodiments may, however, be embodied in many different forms and should not be construed as being limited to the exemplary embodiments set forth herein; rather these exemplary embodiments are provided so that this disclosure will be thorough and complete, and will fully convey the concept of the exemplary embodiments to one of ordinary skill in the art. Therefore, it should be understood that there can be many equivalents and modified exemplary embodiments that can substitute those described in this specification. In the drawings, like reference numerals denote like elements. Structures in the drawings may be larger or smaller than actual ones for clarity.

The terminology used herein is for the purpose of describing particular exemplary embodiments only and is not intended to be limiting of exemplary embodiments. As used herein, the singular forms "a", "an", and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As the number of transistors included in an integrated circuit has increased and an operating frequency of the integrated circuit has increased, power consumed by the integrated circuit has increased. If power consumption is not managed, it may cost a significant amount to satisfy a thermal requirement of the integrated circuit or the integrated circuit may not be realized. Satisfying the thermal requirement of the integrated circuit refers to an activity of providing components so that the integrated circuit may be maintained in thermal limits by appropriately cooling the integrated circuit during an operation. In applications, such as a battery-powered device, power consumption management of an integrated circuit is an important factor in providing an appropriate battery lifetime.

Power consumption of an integrated circuit is related to a power supply voltage applied to the integrated circuit. Power consumed by an integrated circuit depends on a level of a power supply voltage with respect to a ground voltage. In general, power consumption may be reduced by reducing a level of a power supply voltage.

FIG. 1 is a block diagram illustrating an integrated circuit 10 according to an exemplary embodiment.

Referring to FIG. 1, the integrated circuit 10 includes a plurality of logic circuits 12 and a plurality of memory circuits 14. The logic circuits 12 are connected to the memory circuits 14. The logic circuits 12 are included in a first circuit area 11 that is driven by a first power supply voltage VDDL, and the memory circuits 14 are included in a second circuit area 13 that is driven by a second power supply voltage VDDS. The first power supply voltage VDDL and the second power supply voltage VDDS may be applied from the outside of the integrated circuit 10. Alternatively, the first power supply voltage VDDL and the second power supply voltage VDDS may be applied from a voltage generating unit (not shown) in the integrated circuit 10. The second power supply voltage VDDS may be set to be higher than the first power supply voltage VDDL. The integrated circuit 10 may include the logic circuits 12 and the memory circuits 14 which are integrated on one semiconductor substrate.

The logic circuits 12 may indicate logic states (1 and 0 states) by using the first power supply voltage VDDL and a ground voltage VSS. The logic circuits 12 may be evaluated with a logic signal that changes from the first power supply voltage VDDL to the ground voltage VSS, or from the ground voltage VSS to the first power supply voltage VDDL, during operation. Power consumption of the logic circuits 12 depends on a relative level of the first power supply voltage VDDL with respect to the ground voltage VSS. Power consumption of the logic circuits 12 may be reduced by reducing a level of the first power supply voltage VDDL. The first power supply voltage VDDL may be reduced to a level by which an operation of the logic circuits 12 may be normally performed.

The logic circuits 12 may perform an operation in accordance with an objective of the integrated circuit 10. The logic circuits 12 may generate various data values and store the various data values in the memory circuits 14 during operation. Also, the logic circuits 12 may read the various data values from the memory circuits 14. The memory circuits 14 may include a memory that is used as, for example, a cache or a register. The memory circuits 14 may be memories that may read and write data.

The logic circuits 12 may generate various control signals CTL in order to access the memory circuits 14. The control signals CTL may include an address signal indicating a location of a memory to be accessed in the memory circuits 14, a read-enable signal indicating a read operation, and a write-enable signal indicating a write operation. In the read operation, the memory circuits 14 output data to the logic circuits 12. In the write operation, the logic circuits 12 provide data to be stored to the memory circuits 14. According to an exemplary embodiment, the control signals CTL provided by the logic circuits 12 are signals that operate with the first power supply voltage VDDL and the ground voltage VSS.

Figure 2:
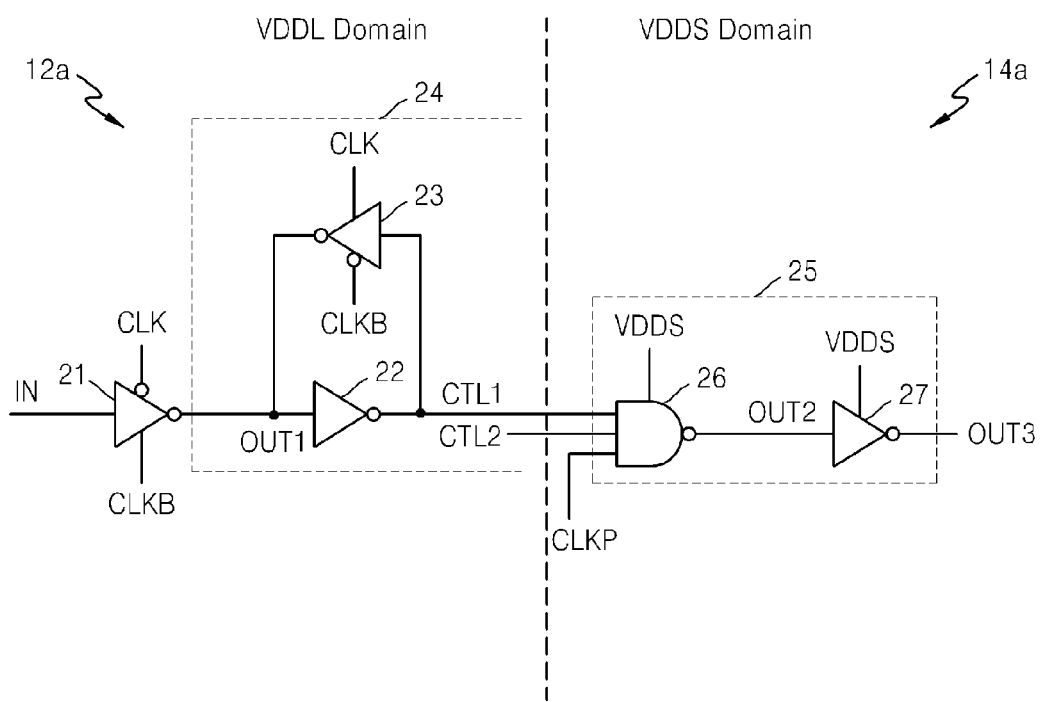
FIG. 2 is a diagram illustrating an interface between logic circuits and memory circuits, according to an exemplary embodiment.

FIG. 2 is a diagram illustrating an interface between the logic circuits 12 and the memory circuits 14, according to an exemplary embodiment.

Referring to FIG. 2, a logic circuit 12a may be one of the logic circuits 12 of FIG. 1. A memory circuit 14a may be one of the memory circuits 14 of FIG. 1. The logic circuit 12a may be described as using a domain that is driven by the first power supply voltage VDDL, and the memory circuit 14a may be described as using a domain that is driven by the second power supply voltage VDDS. That is, the logic circuit 12a and the memory circuit 14a are circuits that are driven in different voltage domains.

The logic circuit 12a may include a plurality of inverters, for example, first through third inverters 21, 22, and 23. The first power supply voltage VDDL is supplied to the first through third inverters 21, 22, and 23. The first inverter 21 receives an input signal IN and outputs an output signal OUT1 in response to a first clock signal CLK and an inverted first clock signal CLKB. For example, the first inverter 21 is a clocked inverter that inverts the input signal IN in response to a falling edge of the first clock signal CLK. The second and third inverters 22 and 23 are cross-coupled to each other to constitute a latch 24. An output of the first inverter 21 is connected to the latch 24.

The latch 24 inverts and latches the received output signal OUT1 of the first inverter 21 and outputs a first control signal CTL1. The second inverter 22 receives and inverts the output signal OUT1 of the first inverter 21 and outputs the first control signal CTL1. The third inverter 23 receives the first control signal CTL1 in response to the first clock signal CLK and the inverted first clock signal CLKB, and an output of the third inverter 23 is provided as an input of the second inverter 22. For example, the third inverter 23 may be implemented as a clocked tri-state inverter that inverts the first control signal CTL1 in response to a logic high level of the first clock signal CLK, although the third inverter 23 is not limited thereto and may be implemented as other types of inverters.

In the logic circuit 12a, the input signal IN, the first clock signal CLK, the inverted first clock signal CLKB, the output signal OUT1, and the first control signal CTL1 are signals that operate between the first power supply voltage VDDL and the ground voltage VSS. The logic circuit 12a generates the first control signal CTL 1 having the same logic level as that of the input signal IN. The first control signal CTL1 may be one of the control signals CTL of FIG. 1.

The memory circuit 14a is connected to the logic circuit 12a through an interface circuit 25. The interface circuit 25 may include a clocked gate 26 and a fourth inverter 27. The second power supply voltage VDDS is supplied to the clocked gate 26 and the fourth inverter 27. The clocked gate 26 may be implemented as a NAND gate into which the first and second control signals CTL1 and CTL2 and a second clock signal CLKP are input. Alternatively, the clocked gate 26 may be a logic gate other than a NAND gate.

The first control signal CTL1 is provided from the logic circuit 12a. The second control signal CTL2 may also be provided from the logic circuit 12a. The first and second control signals CTL1 and CTL2 are signals that operate at a first power supply voltage level and a ground voltage level.

The second clock signal CLKP may be a signal provided in a second power supply voltage domain. The second clock signal CLKP is a signal that operates at a second power supply voltage level and the ground voltage level. The clocked gate 26 receives the first and second control signals CTL1 and CTL2 and the second clock signal CLKP, and outputs an output signal OUT2. The output signal OUT2 is provided to the fourth inverter 27, and the fourth inverter 27 outputs an output signal OUT3.

Figure 3:
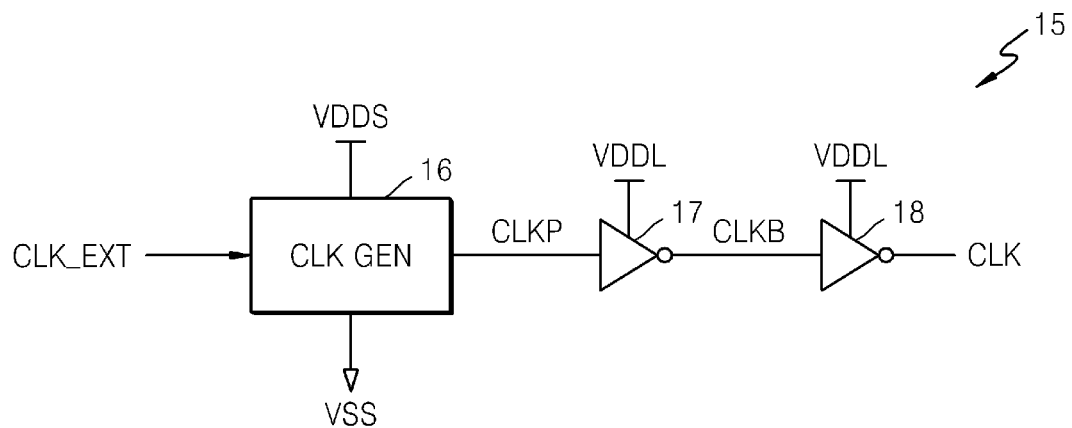
FIG. 3 is a diagram illustrating a clock signal generating circuit according to an exemplary embodiment.

FIG. 3 is a diagram illustrating a clock signal generating circuit 15 according to an exemplary embodiment.

Referring to FIG. 3, the clock signal generating circuit 15 may receive an external clock signal CLK_EXT and may generate the first clock signal CLK and the inverted first clock signal CLKB, and the second clock signal CLKP. The clock signal generating circuit 15 may include a clock receiving unit 16 that receives the external clock signal CLK_EXT, and first and second inverters 17 and 18 that are serially connected to each other and are connected to an output of the clock receiving unit 16.

The clock receiving unit 16 may be driven by the second power supply voltage VDDS, may receive the external clock signal CLK_EXT, and may generate the second clock signal CLKP having the second power supply voltage level. The clock receiving unit 16 may include a differential cross-coupled latch type clock generating unit. The clock generating unit 16 may function as a level shifter and a buffer. The external clock signal CLK_EXT may have the first power supply voltage level or the second power supply voltage level. The second clock signal CLKP may be input to the first inverter 17, and the first inverter 17 may generate the inverted first clock signal CLKB. The inverted first clock signal CLKB may be input to the second inverter 18, and the second inverter 18 may generate the first clock signal CLK. The first and second inverters 17 and 18 are driven by the first power supply voltage VDDL, and each of the first clock signal CLK and the inverted first clock signal CLKB has the first power supply voltage level.

The clock signal generating circuit 15 may receive the external clock signal CLK_EXT, and may generate the first clock signal CLK and the second clock signal CLKP, which are synchronized with each other. In this case, the first clock signal CLK has the first power supply voltage level, and the second clock signal CLKP has the second power supply voltage level.

Figure 4:
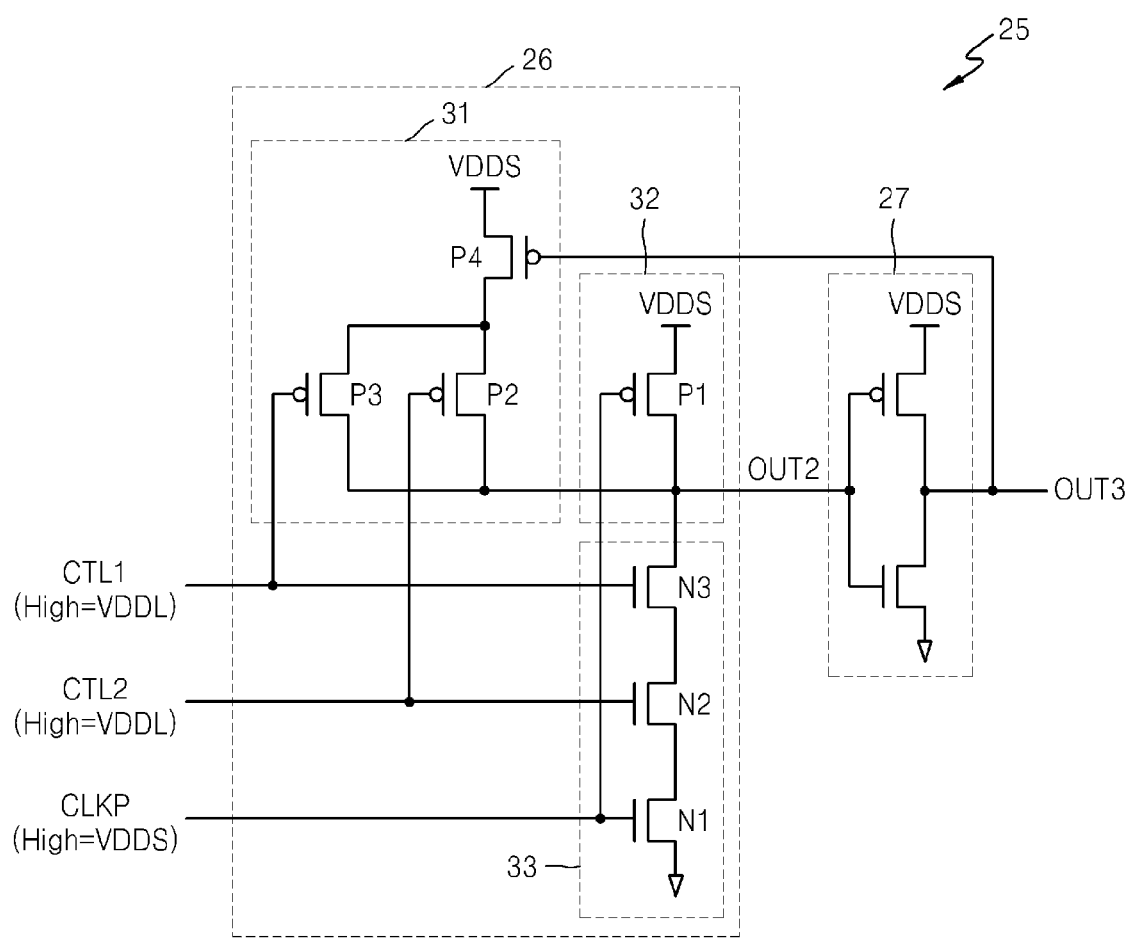
FIG. 4 is a circuit diagram illustrating an interface circuit of FIG. 2, according to an exemplary embodiment.

FIG. 4 is a circuit diagram illustrating the interface circuit 25 of FIG. 2, according to an exemplary embodiment.

Referring to FIG. 4, the interface circuit 25 includes the clocked gate 26 and the fourth inverter 27. The clocked gate 26 is driven by the second power supply voltage VDDS. The clocked gate 26 includes a first circuit unit 31, a second circuit unit 32, and a third circuit unit 33. The first circuit unit 31 is supplied with power at the second power supply voltage level due to the output signal OUT3 of the fourth inverter 27. The first circuit unit 31 includes a plurality of PMOS transistors P2, P3, and P4. The PMOS transistor P4 has a source to which the second power supply voltage VDDS is connected and a gate to which the output signal OUT3 of the fourth inverter 27 is connected. The PMOS transistor P3 has a gate to which the first control signal CTL1 is connected and a source to which a drain of the PMOS transistor P4 is connected. The PMOS transistor P2 has a gate to which the second control signal CTL2 is connected and a source to which the drain of the PMOS transistor P4 is connected. Drains of the PMOS transistors P2 and P3 are connected to each other, and are connected to the output signal OUT2 of the clocked gate 26.

The PMOS transistor P1 of the second circuit unit 32 has a source to which the second power supply voltage VDDS is connected, a gate to which the second clock signal CLKP is connected, and a drain to which the output signal OUT2 of the clocked gate 26 is connected. The third circuit unit 33 includes NMOS transistors N1 through N3 that are serially connected between the ground voltage VSS and the output signal OUT2 of the clocked gate 26. The NMOS transistor N3 has a drain to which the output signal OUT2 of the clocked gate 26 is connected and a gate to which the first control signal CTL1 is connected. The NMOS transistor N2 has a drain to which a source of the NMOS transistor N3 is connected and a gate to which the second control signal CTL2 is connected. The NMOS transistor N1 has a drain to which a source of the NMOS transistor N2 is connected, a gate to which the second clock signal CLKP is connected, and a source to which the ground voltage VSS is connected.

The fourth inverter 27 receives the output signal OUT2 of the clocked gate 26 and is driven by the second power supply voltage VDDS. The fourth inverter 27 outputs the output signal OUT3 by inverting a logic level of the output signal OUT2 of the clocked gate 26. The output signal OUT3 of the fourth inverter 27 acts as a signal that supplies power having the second power supply voltage level to the first circuit unit 31. That is, the PMOS transistor P4 is turned on due to the output signal OUT3 of the fourth inverter 27 having a logic low level, and the second power supply voltage VDDS operates as a power source of the first circuit unit 31.

When the second clock signal CLKP has a logic low level, the interface circuit 25 operates in a pre-charge mode. In the pre-charge mode, the PMOS transistor P1 is turned on, the output signal OUT2 of the clocked gate 26 is changed to the second power supply voltage VDDS, and the output signal OUT3 of the fourth inverter 27 is generated at a logic low level.

When the second clock signal CLKP has a logic high level, the interface circuit 25 operates in an evaluation mode. In the evaluation mode, when any one of the first and second control signals CTL1 and CTL2 has a logic low level, the output signal OUT2 of the clocked gate 26 maintains the second power supply voltage VDDS. When both the first and second control signals CTL1 and CLT2 have logic high levels, the NMOS transistors N1 through N3 are turned on and the output signal OUT2 of the clocked gate 26 begins to be discharged. The output signal OUT2 of the clocked gate 26 is discharged to the ground voltage level, and the output signal OUT3 of the fourth inverter 27 is changed to a logic high level. The output signal OUT3 of the fourth inverter 27 of the logic high level is fed back, and the PMOS transistor P4 is turned off. The output signal OUT2 of the clocked gate 26 is eventually completely discharged to the ground voltage VSS. In order to completely turn off the PMOS transistor P1 during an evaluation mode, the second clock signal CLKP is provided at the second power supply voltage level.

In FIG. 4, the first circuit unit 31 may also be referred to as a weak keeper device that is supplied with power at the second power supply voltage level due to the output signal OUT3 of the fourth inverter 27, and responds to the first and second control signals CTL1 and CTL2. The second circuit unit 32 may also be referred to as a strong pre-charge device that responds to the second clock signal CLKP. The third circuit unit 33 may be referred to as a strong evaluation device that responds to the first and second control signals CTL1 and CTL2 and the second clock signal CLKP.

The interface circuit 25 receives the first and second control signals CTL1 and CTL2 having the first power supply voltage level and shifts a level of the output signal OUT3 to the second power supply voltage level. When the first and second control signals CTL1 and CTL2 are address signals, the interface circuit 25 simultaneously performs an addressing decoding operation and a level shifting operation. Accordingly, since an addressing decoding time and a level shifting time may be the same, the interface circuit 25 may also be referred to as a zero-delay level shifter. Also, since the interface circuit 25 has a master latch and a slave latch connected to the master latch and functions as a master-slave latch, an additional circuit may not be used.

Figure 5:
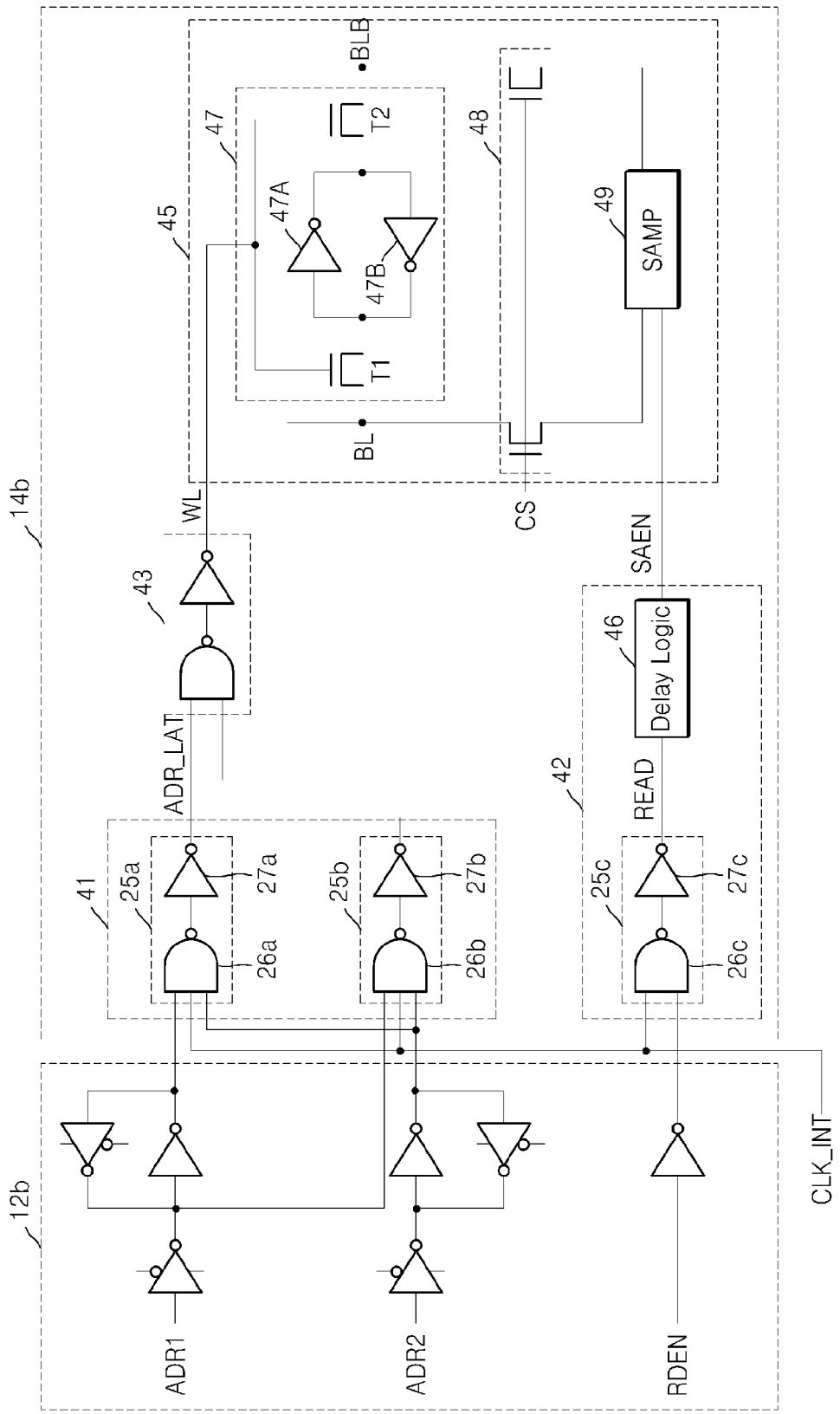
FIG. 5 is a circuit diagram illustrating a memory circuit included in the integrated circuit, according to an exemplary embodiment.

FIG. 5 is a circuit diagram illustrating a memory circuit 14b included in the integrated circuit 10, according to an exemplary embodiment.

Referring to FIG. 5, a logic circuit 12b may be one of the logic circuits 12 of FIG. 1. The memory circuit 14b may be one of the memory circuits 14 of FIG. 1. The memory circuit 14b is connected to the logic circuit 12b, and receives address signals ADR1 and ADR2 and a read-enable signal RDEN output from the logic circuit 12b. As described with reference to FIG. 2, the logic circuit 12b operates in a first power supply voltage domain, and the address signals ADR1 and ADR2 and the read-enable signal RDEN are signals that operate at the first power supply voltage level and the ground voltage level.

The memory circuit 14b operates in a second power supply voltage domain. The memory circuit 14b includes an address decoder 41, a control signal generating unit 42, a word line driver 43, and a memory array 45. The address decoder 41 includes a plurality of interface circuits, for example, first and second interface circuits 25a and 25b, which receive the address signals ADR1 and ADR2 and an internal clock signal CLK_INT. The first and second interface circuits 25a and 25b include clocked gates 26a and 26b, respectively, and inverters 27a and 27b, respectively. Each of the first and second interface circuits 25a and 25b may have the same structure as the interface circuit 25 described with reference to FIG. 3, although it is understood that the first and second interface circuits 25a and 25b may have different structures as well.

The first and second interface circuits 25a and 25b are connected between the logic circuit 12b and the memory circuit 14b. The first interface circuit 25a operates in the second power supply voltage domain, receives (is input with) the address signals ADR1 and ADR2 and the internal clock signal CLK_INT, and outputs an address latch signal ADR_LAT. The address signals ADR1 and ADR2 are provided at the first power supply voltage level, and the internal clock signal CLK_INT is provided at the second power supply voltage level. The first interface circuit 25a is supplied with power at the second power supply voltage level due to the address latch signal ADR_LAT, which is an output of the first interface circuit 25a. Likewise, the second interface circuit 25b is supplied with power at the second power supply voltage level due to an output of the second interface circuit 25b.

The control signal generating unit 42 includes a third interface circuit 25c that receives (is input with) the read-enable signal RDEN and the internal clock signal CLK_INT. The third interface circuit 25c may be configured as shown in FIG. 6.

Figure 6:
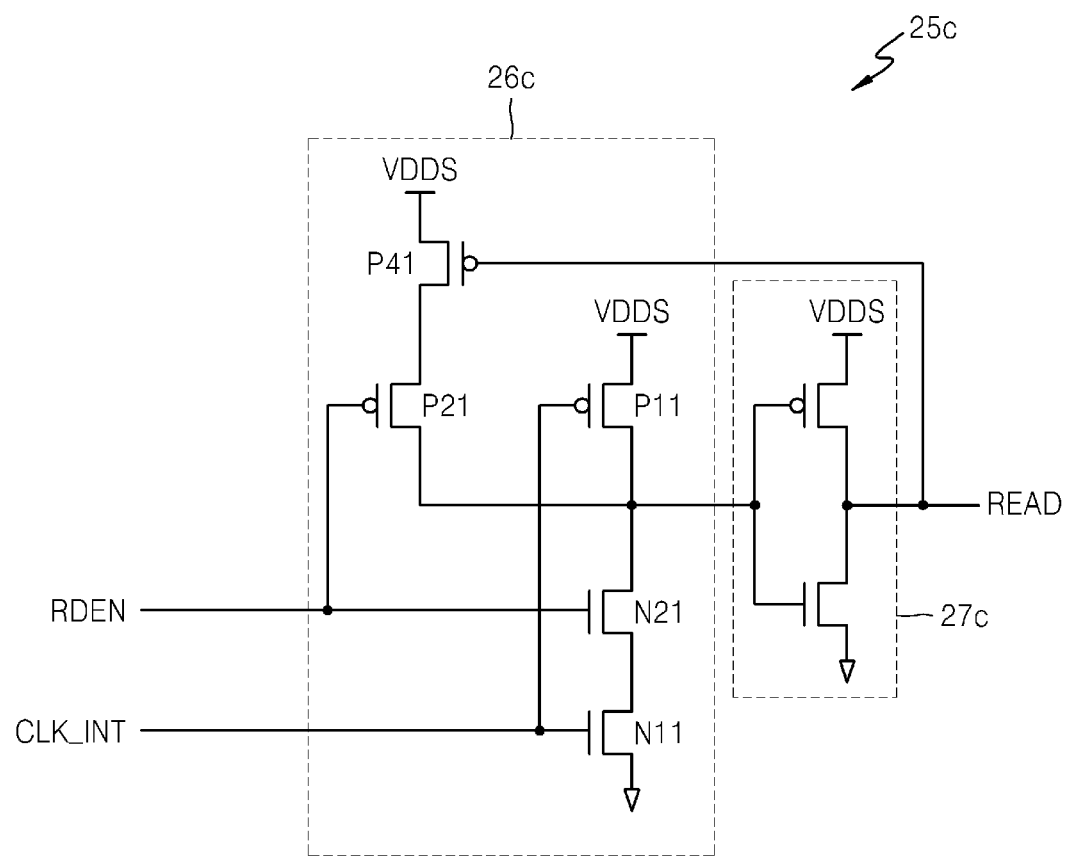
FIG. 6 is a circuit diagram illustrating a third interface circuit of FIG. 5, according to an exemplary embodiment.

FIG. 6 is a circuit diagram illustrating the third interface circuit 25c of FIG. 5, according to an exemplary embodiment.

Referring to FIG. 6, the third interface circuit 25c is driven by the second power supply voltage VDDS, receives (is input with) the read-enable signal RDEN and the internal clock signal CLK_INT, and outputs a read signal READ. The third interface circuit 25c includes a 2-input clocked gate 26c that receives (is input with) the read-enable signal RDEN and the internal clock signal CLK_INT, and an inverter 27c that receives (is input with) an output of the 2-input clocked gate 26c and outputs the read signal READ. The 2-input clocked gate 26c includes PMOS transistors P11, P21, and P41, and NMOS transistors N11 and N21.

The PMOS transistors P41 and P21 are serially connected to each other. The PMOS transistor P41 is connected to the second power supply voltage VDSS, is gated to the read voltage READ, and supplies the second power supply voltage VDDS to the PMOS transistor P21. The PMOS transistor P21 has a gate to which the read-enable signal RDEN is connected. The PMOS transistor P11 is connected to the second power supply voltage VDDS, and has a gate to which the internal clock signal CLK_INT is connected. Drains of the PMOS transistors P11 and P21 are connected to each other to obtain an output of the 2-input clocked gate 26c. The NMOS transistors N21 and N11 are serially connected to each other between the ground voltage VSS and the output of the 2-input clocked gate 26c. The read-enable signal RDEN is connected to a gate of the NMOS transistor N21, and the internal clock signal CLK_INT is connected to a gate of the NMOS transistor N11.

The inverter 27c receives (is input with) the output of the 2-input clocked gate 26c and outputs the read signal READ. The read signal READ acts a power supply signal that supplies the second power supply voltage VDDS to the PMOS transistor P21. That is, the PMOS transistor P41 is turned on due to the read signal READ of a logic low level, and the second power supply voltage VDDS is supplied to the PMOS transistor P21.

In the third interface circuit 25c, when the internal clock signal CLK_INT has a logic low level, the PMOS transistor P11 is turned on, the output of the 2-input clocked gate 26c becomes the second power supply voltage VDDS, and the read signal READ is generated at a logic low level. When the internal clock signal CLK_INT has a logic high level and the read-enable signal RDEN has a logic low level, the output of the 2-input clocked gate 26c maintains the second power supply voltage VDDS. When the read-enable signal RDEN has a logic high level, the NMOS transistors N11 and N21 are turned on, the output of the 2-input clocked gate 26c is discharged to the ground voltage level, and the read signal READ is changed to a logic high level. The read signal READ of the logic high level is fed back to a gate of the PMOS transistor P41, and the PMOS transistor P41 is turned off. The output of the 2-input clocked gate 26c is eventually completely discharged to the ground voltage VSS. In order to completely turn off the PMOS transistor P11, the internal clock signal CLK_INT is provided at the second power supply voltage level.

Referring back to FIG. 5, the read signal READ output from the third interface circuit 25c of the control signal generating unit 42 in the memory circuit 14b is provided to a delay logic unit 46 that generates a sensing enable signal SAEN. The delay logic unit 46 receives the read signal READ and generates the sensing enable signal SAEN after a sufficient delay (e.g., a delay equal to or greater than a threshold) for sensing memory cell data of the memory array 45.

The word line driver 43 receives the address latch signal ADR_LAT output from the address decoder 41 and drives a word line WL. The memory array 45 includes memory cells 47, bit-line selection units 48, and sense amplifier units 49. One memory cell 47 includes a typical complementary metal-oxide semiconductor (CMOS) SRAM cell including cross-coupled inverters 47A and 47B connected to a pair of bit-lines BL and BLB through NMOS transistors T1 and T2. Gates of the NMOS transistors T1 and T2 are connected to the word line WL. When the word line WL is enabled to a logic high level, the NMOS transistors T1 and T2 provide a conducting path between the bit-lines BL and BLB and the inverters 47A and 47B.

Each of the bit-line selection units 48 connects the bit-lines BL and BLB to the sense amplifier unit 49 in response to a bit-line selection signal CS. The sense amplifier unit 49 senses and amplifies voltage levels of the bit-lines BL and BLB and outputs a pair of differential signals in response to the sensing enable signal SAEN.

According to the present exemplary embodiment, the address signals ADR1 and ADR2 provided to the logic circuit 12b and the read-enable signal RDEN are signals that operate at the first power supply voltage level. The first through third interface circuits 25a, 25b, and 25c of the memory circuit 14b, which receive the address signals ADR1 and ADR2 and the read-enable signal RDEN having the first power supply voltage level, generate the address latch signal ADR_LAT and the read signal READ having the second power supply voltage level. That is, the first through third interface circuits 25a, 25b, and 25c are supplied with power at the second power supply voltage level due to the read signal READ and the address latch signal ADR_LAT which are outputs thereof, and shift levels of the address input signals ADR1 and ADR2 and the read signal READ to the second power supply voltage level.

As the first power supply voltage level of the first power supply voltage VDDL that drives the logic circuit 12b is sufficiently reduced due to the first through third interface circuits 25a, 25b, and 25c, power consumption of the integrated circuit 10 may be reduced.

Figure 7:
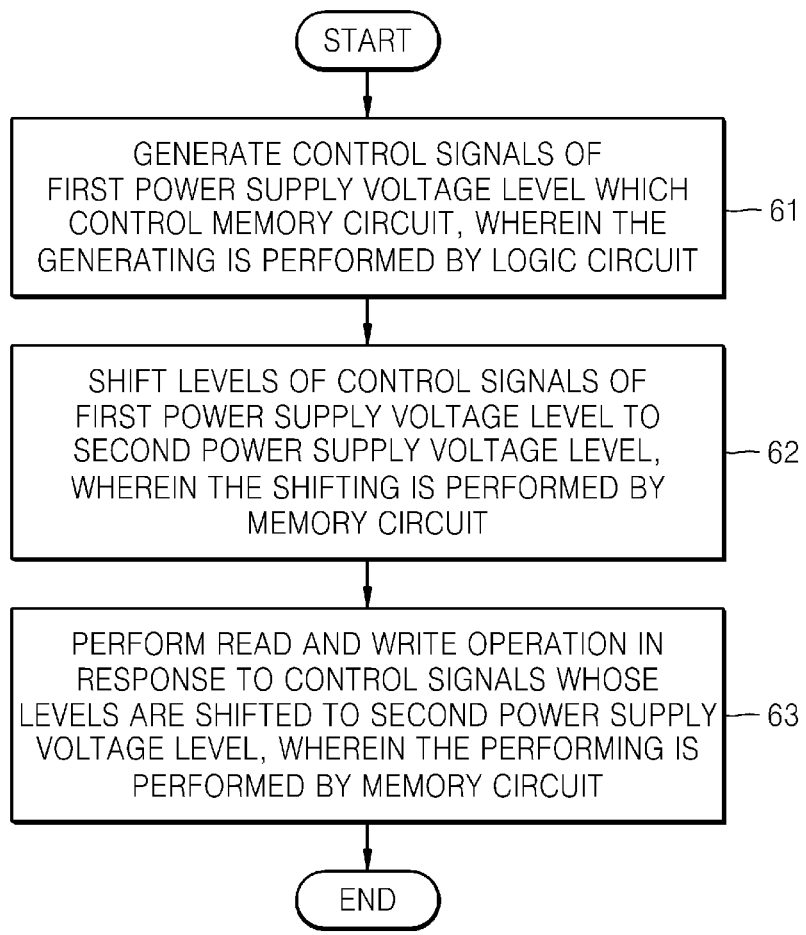
FIG. 7 is a flowchart illustrating an operation method of the memory circuit of FIG. 5, according to an exemplary embodiment.

FIG. 7 is a flowchart illustrating an operation method of the memory circuit of FIG. 5, according to an exemplary embodiment.

Referring to FIG. 7, in operation 61, the logic circuit 12b generates control signals having the first power supply voltage level which control the memory circuit 14b. The control signals include the address signals ADR1 and ADR2 and the read-enable signal RDEN that read and write the memory circuit 14b. In operation 62, the memory circuit 14b receives the control signals having the first power supply voltage level, and shifts levels of the control signals to the second power supply voltage level. In operation 63, the memory circuit 14b performs read and write operations in response to the control signals having the levels which are shifted to the second power supply voltage level.

Figure 8:
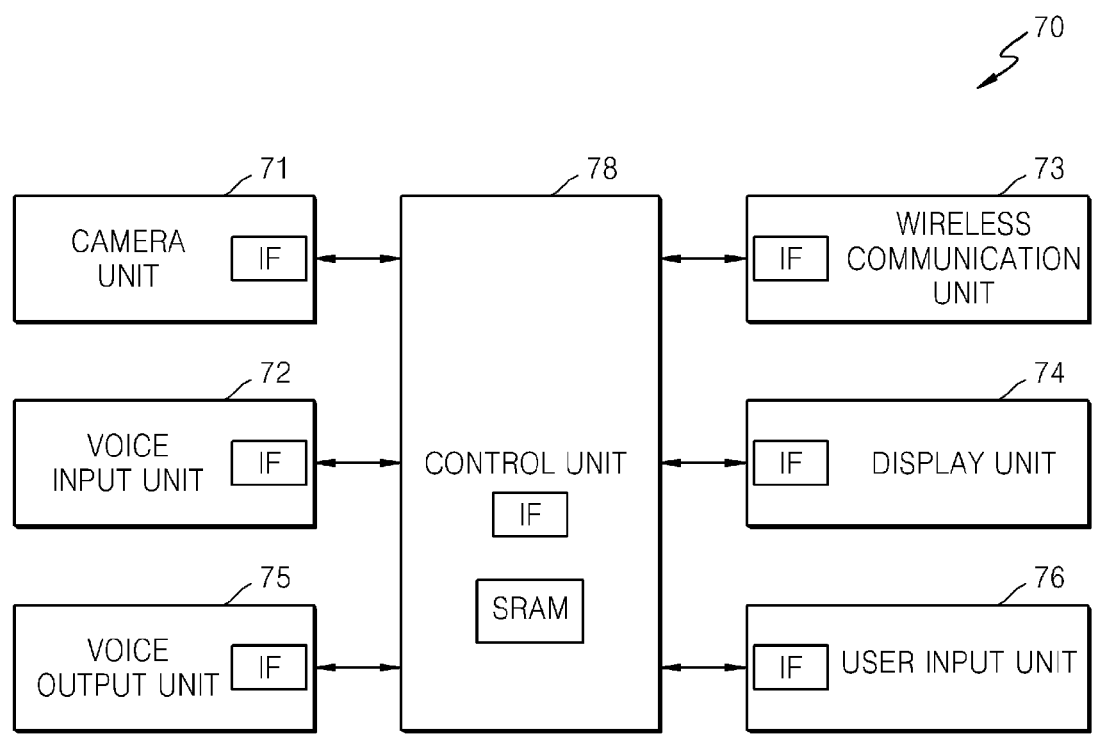
FIG. 8 is a block diagram illustrating a system including an interface circuit, according to an exemplary embodiment.

FIG. 8 is a block diagram illustrating a system 70 including an interface unit, according to an exemplary embodiment.

Referring to FIG. 8, the system 70, which is a mobile terminal having a wireless network communication function, may be implemented as any of various devices, such as a mobile phone, a mobile personal computer (PC), or a personal portable terminal. The system 70 supports a call between a transmitter and a receiver. Examples of the call supported by the system 70 include a voice call and a video call that is performed by transmitting and receiving an image and a voice. It is understood that the system 70 may support many other types of communications and messaging techniques as well, e.g., SMS, etc.

A communication method performed by the system 70 may be, for example, wideband code division multiple access (W-CDMA), enhanced data rates for global system for mobile (GSM) evolution (EDGE), long term evolution (LTE), or worldwide interoperability for microwave access (WiMAX). A wireless network may include a base station transmission system for transmitting and receiving a wireless communication signal to and from the system 70, a base station controller that controls and manages a plurality of base stations, and a switching center that performs call switching between systems through the base station controller.

The system 70 includes a camera unit 71, a voice input unit 72, a wireless communication unit 73, a display unit 74, a voice output unit 75, a user input unit 76, and a control unit 78.

The camera unit 71 photographs an object and generates an image. The camera unit 71 may include an optical unit that includes at least one lens on which light is incident, and an image sensor that converts the light incident on the lens into electrical data and generates an image. The image sensor of the camera unit 71 may be implemented as many different types, for example, as a RAW-Bayer and/or CMOS type that operates using an image processing unit through a sensor interface. The image sensor of the camera unit 71 may include a plurality of photodetectors that convert light detected by the image sensor into an electrical signal. The image sensor may further include a color filter array that filters light captured by the image sensor and captures color information.

The voice input unit 72 includes a voice sensor, such as a microphone, and receives (inputs) a voice necessary for a voice call.

The wireless communication unit 73 is connected to a wireless network and communicates with at least one other party's terminal in a wireless manner. The wireless communication unit 73 transmits image call data, including a voice input into the voice input unit 72 and/or an image generated by the camera unit 71, to the other party's terminal, and receives image call data, including image data and/or voice data from the other party's terminal, under the control of the control unit 78 during a call.

The display unit 74 may display an image on a screen, and may include a display device such as a liquid crystal display (LCD). The display unit 74 may display an image generated by the camera unit 71 under the control of the control unit 78.

The voice output unit 75 may output voice data or other audio data, and may include a voice output device, such as an internal speaker. Also, the voice output unit 75 may further include a connector for connecting to an external voice output device, such as earphones, a headset, or an external speaker, and may output voice data or other audio data to the external voice output device. The voice output unit 75 may output voice data or other audio data from the other party's terminal under the control of the control unit 78 during a voice call or an image call.

The user input unit 76 receives a user's input for manipulating the system 70. The user input unit 76 may include a keypad including a plurality of keys for inputting numbers or text. The keypad may be a touchpad. The user input unit 76 may further include a detection sensor that detects the user's motion (e.g., hand motion) or a gesture on the display unit 74 as a user input. The detection sensor of the user input unit 76 may be implemented as a touch-screen provided to overlap with a panel type display device of the display unit 74, such as an LCD.

The control unit 78 controls the overall system 70. When a call function is selected by the user's input through the user input unit 76, the control unit 78 requests the other party's terminal to establish a call connection through the wireless communication unit 73 by referring to an input phone number. When the call connection is carried out, the control unit 78 controls call data, including voice data input by the voice input unit 72 and/or image data generated by the camera unit 71, to be transmitted to the other party's terminal through the wireless communication unit 73, and image data and/or voice data included in call data received from the other party's terminal through the wireless communication unit 73 to be output by the display unit 74 and/or the voice output unit 75.

The control unit 78 performs a plurality of image processing operations on image data captured by the image sensor of the camera unit 71 through an image processing pipeline to obtain a processed image. The processed image may be displayed on the display unit 74. As a resolution and a frame rate of a processed image increases, there is a demand for an image signal processing system suitable for the image data.

The control unit 78 may include a predetermined memory area to store processed data. The memory area in the control unit 78 may be implemented as SRAM including the first through third interface circuits 25a, 25b, and 25c of FIG. 5.

In the system 70, the camera unit 71, the voice input unit 72, the wireless communication unit 73, the display unit 74, the voice output unit 75, the user input unit 76, and the control unit 78 may be driven by the first power supply voltage VDDL or the second power supply voltage VDDS that is higher than the first power supply voltage VDDL, that is, may be driven in different voltage domains. The control unit 78 of the system 70 may be driven by the first power supply voltage VDDL, and may provide a control signal having the first power supply voltage level to the camera unit 71, the voice input unit 72, the wireless communication unit 73, the display unit 74, the voice output unit 75, and the user input unit 76 which are driven by the second power supply voltage VDDS. Also, the control unit 78 may be driven by the second power supply voltage VDDS, and may receive a control signal having the first power supply voltage level from the camera unit 71, the voice input unit 72, the wireless communication unit 73, the display unit 74, the voice output unit 75, and the user input unit 76 which are driven by the first power supply voltage VDDL.

Each of the camera unit 71, the voice input unit 72, the wireless communication unit 73, the display unit 74, the voice output unit 75, the user input unit 76, and the control unit 78 of the system 70 may include an interface circuit IF that receives a control signal having the first power supply voltage level and shifts a level of the control signal to the second power supply voltage level and outputs the control signal with the shifted level as an output signal. The interface circuit IF is supplied with the second power supply voltage VDDS as a power source, inputs a control signal having the first power supply voltage level in response to a clock signal, and shifts a level of an output to the second power supply voltage level.

Figure 9:
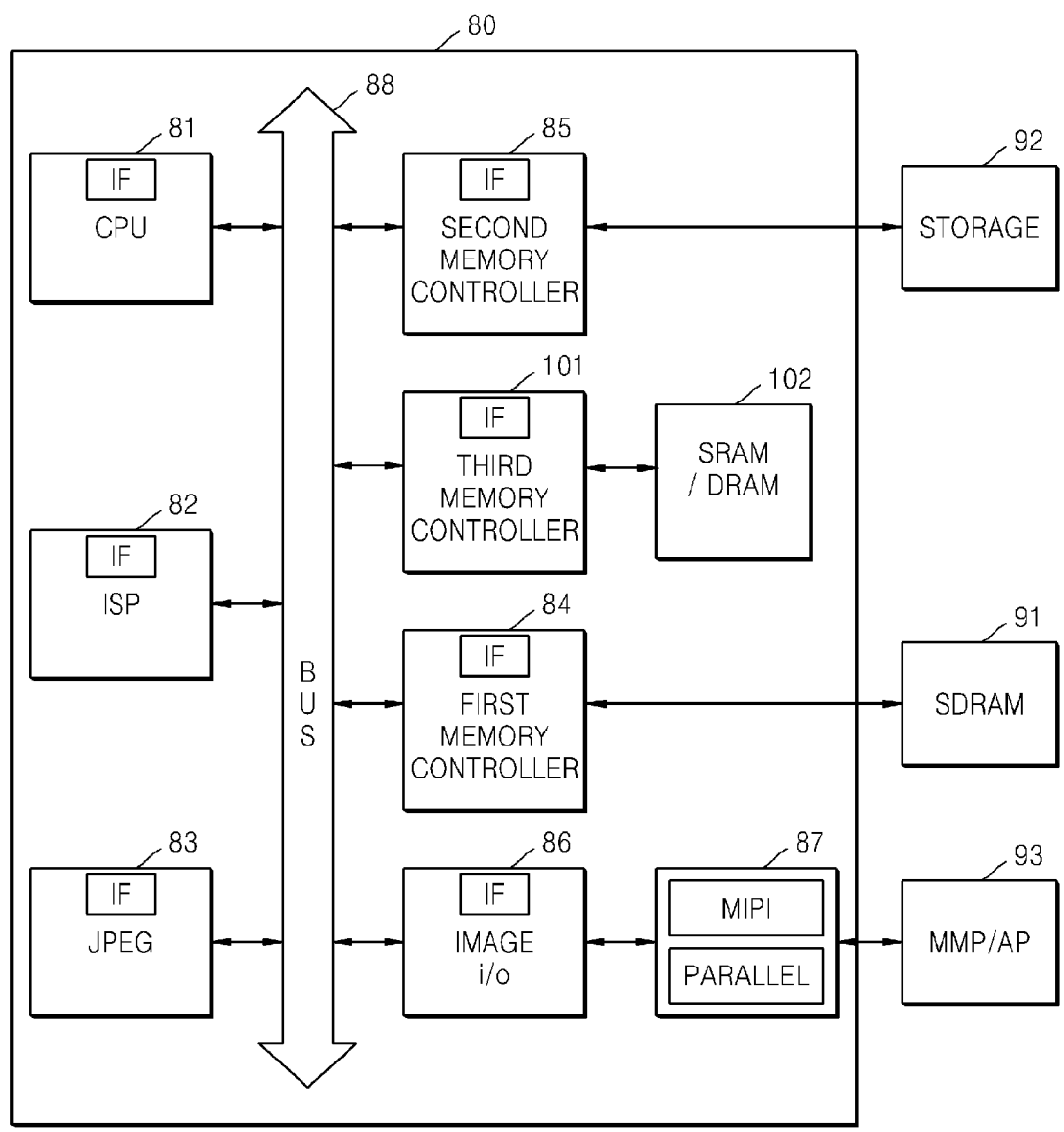
FIG. 9 is a block diagram illustrating a system including an interface circuit, according to another exemplary embodiment.

FIG. 9 is a block diagram illustrating a system 80 including an interface circuit, according to another exemplary embodiment.

Referring to FIG. 9, the system 80 may be implemented as an image processing system included in the control unit 78 of FIG. 7. The system 80 may include a central processing unit (CPU) 81, an image signal processor (ISP) 82, an image codec unit 83, first and second memory controllers 84 and 85, an image input/output unit 86, and an interface unit 87. Also, the system 80 may further include a third memory controller 101 that controls a memory area 102 in the system 80. The memory area 102 may be implemented as SRAM or dynamic random-access memory (DRAM) including the first through third interface circuits 25a, 25b, and 25c of FIG. 5.

The ISP 82 may include a Bayer processing unit, an RGB processing unit, and a scaling/rotating/Affine-transform processing unit. The ISP 82 may control, for example, image size, color depth, detecting whether a pixel is dead or alive, lens shading compensation, adaptive color interpolation, color correction, gamma control, hue/gain control, image effect, auto exposure, and auto white balance, in order to control processes of each unit. Image data processed by the ISP 82 may be transmitted to the image codec unit 83 via a bus 88.

The image codec unit 83 may perform image encoding and decoding on image data for easy transmission and storage. The image codec unit 83 may include a joint photographic experts group (JPEG) codec unit and may generate a high-resolution JPEG image. In JPEG, image data is compressed in units of blocks, and is recovered and reproduced by scanning a compressed stream of block data for a position to be decoded from the first part of a file.

Baseline JPEG, which is a minimum set of JPEG, involves converting image data from RGB to YIQ, dividing each YIQ image into 8×8 pixel macroblocks, performing a discrete cosine transform (DCT), linearly quantizing a DCT coefficient which is a resultant value of the DCT in different step sizes for each coefficient by using a quantization table, separating a visually important portion and a visually less important portion, and saving the visually important portion and deleting the visually less important portion to reduce the amount of data. An 8×8 block of data is a minimum coding unit. When a minimum block unit is changed, a size of block data may be changed.

A DCT coefficient blocked and quantized in units of macroblocks includes one DC component and 63 AC components. The DC component performs differential pulse code modulation (DPCM) on a differential signal from an adjacent previous block in consideration of a correlation between adjacent signals, and the AC components align blocks by using zigzag scanning and then perform run-length coding.

A JPEG image compressed by a JPEG compression method is divided into a plurality of macroblocks, and each of the macroblocks includes an EOB code by which a block is ended and one DC component. The macroblock constituting the JPEG image has mutually dependent DC values.

The ISP 82 corrects an image to reduce noise in JPEG image data. The ISP 82 may adjust DC/AC coefficients of 8×8 block data. The ISP 82 reduces noise by separating an image area according to DC/AC threshold values, and then adjusting or controlling DC/AC coefficients. The ISP 82 reduces blocky noise by adjusting an AC coefficient. Also, the ISP 82 may apply brightness enhancement to block data by adjusting DC/AC coefficients.

The CPU 81 is a microprocessor including hardware, software, and/or firmware necessary to perform the method of processing image data. The CPU 81 may include a graphics processing unit (GPU), which may be referred to as a video processing unit (VPU) in handling a series of complex processes related to image data processing.

The CPU 81 may perform graphic image manipulation and rendering which may be used in various electronic games and other applications. The CPU 81 may receive a command and image data from a host such as a software application. The command is used to specify an operation and a calculation necessary to generate a rendered image by changing image data.

The CPU 81 may control an additional process function, such as a camera function or a multimedia data reproducing function. The CPU 81 may perform a zoom-out function or cropping so that image data is suitable for a size of the display unit 74 (see FIG. 8), and may perform transformation to be suitable for a color standard of image data displayed on the display unit 74.

Commands or image data to be processed by the CPU 81 may be stored in a memory device 91. The memory device 91 may be an external memory device existing outside the system 80. The system 80 may control the memory device 91 through the first memory controller 84. The memory device 91 may be implemented as a volatile memory, such as synchronous dynamic random-access memory (SDRAM). The first memory controller 84 may be an SDRAM controller that controls an operation of SDRAM. The memory device 91 may store a basic input/output system (BIOS), an operation system, and various programs, applications, or firmware having a user interface function.

The memory device 91 may store original image data received from the image sensor of the camera unit 71 (see FIG. 8). The original image data stored in the memory device 91 may be provided to the ISP 82.

The memory device 91 may be used to perform buffering or caching during an operation of the system 80. For example, when image data is output to the display unit 74 (see FIG. 8), the memory device 91 may include at least one frame buffer that buffers the image data. That is, the memory device 91 may store image data before, while, and after the image data is processed.

In addition to the memory device 91, the system 80 may connect to a nonvolatile storage device 92 to permanently store image data and/or commands. The system 80 is connected to the nonvolatile storage device 92 through the second memory controller 85. The nonvolatile storage device 92 is controlled by the second memory controller 85. The nonvolatile storage device 92 may be an external storage device existing outside the system 80, although is not limited thereto and may alternatively be included inside of the system 80.

The nonvolatile storage device 92 may include a flash memory, a hard drive, other optical, magnetic, and/or solid state storage media, or a combination thereof. The second memory controller 85 may be a flash memory controller that controls a flash memory. Although the nonvolatile memory device 92 is a single device in FIG. 9, the nonvolatile storage device 92 may include a combination of one or more storage devices from among the storage devices operating in relation to the system 80.

The nonvolatile storage device 92 may be used to store firmware, data files, image data, software programs, applications, wireless access information, personal information, user preferences, and other types of data. Image data stored in the nonvolatile storage device 92 and/or the memory device 91 may be processed by the system 80 before being output to a display.

Original image data captured by the image sensor of the camera unit 71 may be stored in the memory device 91 through the system 80, and original image data stored in an electronic device, such as a computer, may also be stored in the memory device 91 through the system 80. The memory device 91 may transmit original image data or JPEG image data stored in the memory device 91 to the display unit 74 (see FIG. 8) and display the original image data or the JPEG image data. The display unit 74 (see FIG. 8) may display image data or may display a menu or a command as part of a user interface.

Multimedia devices, such as the camera unit 71 (see FIG. 8), a computer, and/or the display unit 74 (see FIG. 8), may be controlled by a multimedia processor (MMP) or an application processor (AP) to perform additional functions, such as, for example, a camera function, a multimedia file reproduction function, and a three-dimensional (3D) graphic function. An operation mode of a camera function performed by the MMP may be divided into various types of modes, such as, for example, a preview mode and a multimedia operation mode. The preview mode is a mode for seeing a preview of an image before photographing the image, and the multimedia operation mode is a photographing operation mode which captures images according to a camera photographing command input.

The system 80 may be referred to as a front-end processor for image data, and the MMP and/or the AP may be referred to as a back-end processor 93, which is a subsequent processor. The back-end processor 93 may be connected to the camera unit 71 (see FIG. 8), a computer, and/or the display unit 74 (see FIG. 8). The system 80 transmits image data stored in the memory device 91 through the image input/output unit 86 to the back-end processor 93.

The image input/output unit 86 may transmit original image data output from the image sensor of the camera unit 71 (see FIG. 8) to the back-end processor 93. The image input/output unit 86 may transmit image data, which is adjusted to be suitable for a size of the display unit 74 (see FIG. 8) connected to the back-end processor 93. Also, the image input/output unit 86 may output image data which is transformed to be suitable for a color standard of image data displayed on the display unit 74 (see FIG. 8). The interface unit 87 for exchanging image data may be connected between the image input/output unit 86 and the back-end processor 93.

The interface unit 87 may include a mobile industry processor interface (MIPI) and/or a parallel interface that transmits a frame, which is an image data transmission unit. The frame may include an address and essential protocol control information in addition to substantial image information. The frame may be transmitted in units of bits, and may include a header field and a trailer field at the front and back of data. The parallel interface is used when image data has a low resolution and a low frame rate. The MIPI, which is a high-speed serial interface, is used to transmit image data having a high resolution and a high frame rate.

The CPU 81, the ISP 82, the image codec unit 83, the first and second memory controllers 84 and 85, the image input/output unit 86, and the interface unit 87 in the control unit 78 may be driven by the first power supply voltage VDDL or the second power supply voltage VDDS that is higher than the first power supply voltage VDDL, that is, may be driven in different voltage domains. The CPU 81 may be driven by the first power supply voltage VDDL and may provide a first control signal having the first power supply voltage level to the ISP 82, the image codec unit 83, the first and second memory controllers 84 and 85, and the image input/output unit 86 which are driven by the second power supply voltage VDDS. Also, the CPU 81 may be driven by the second power supply voltage VDDS, and may receive a control signal having the second power supply voltage level from the ISP 82, the image codec unit 83, the first and second memory controllers 84 and 85, and the image input/output unit 86 which are driven by the first power supply voltage VDDL.

Each of the CPU 81, the ISP 82, the image codec unit 83, the first and second memory controllers 84 and 85, and the image input/output unit 86 may include the interface unit IF that receives a control signal having the first power supply voltage level and shifts a level of the control signal to an output signal having the second power supply voltage level. The interface circuit IF is supplied with the second power supply voltage VDDS as power according to an output of the interface circuit IF, receives (inputs) a control signal having the first power supply voltage level in response to a clock signal, and shifts a level of an output signal thereof to the second power supply voltage level.

While the disclosure has been particularly shown and described with reference to exemplary embodiments thereof by using specific terms, the exemplary embodiments and terms used herein have merely been used to explain the exemplary embodiments and should not be construed as limiting the scope of the disclosure. The exemplary embodiments should be considered in a descriptive sense only and not for purposes of limitation. Therefore, the scope of the exemplary embodiments is defined not by the detailed description of the exemplary embodiments but by the appended claims, and all differences within the scope will be construed as being included in the exemplary embodiments.

What is claimed is:

1. An integrated circuit comprising:
   a logic circuit configured to be driven by a first power supply voltage having a first power supply voltage level; and
   a memory circuit configured to be driven by a second power supply voltage having a second power supply voltage level different from the first power supply voltage level, the memory circuit comprising a circuit configured to interface with the logic circuit,
   wherein the circuit is configured to be supplied with power at the second power supply voltage level in response to an output signal, and configured to shift a level of a signal having the first power supply voltage level received from the logic circuit to the second power supply voltage level,
   wherein the circuit comprises a clocked gate configured to be driven by the second power supply voltage level and configured to generate the output signal of the circuit in response to the signal and a clock signal,
   wherein the circuit further comprises an interface circuit configured to receive the signal having the first power supply voltage level, and
   wherein the interface circuit comprises:
      a first circuit unit connected between the second power supply voltage and a first node, the first circuit unit configured to be supplied with power at the second power supply voltage level according to the output signal of the clocked gate, and configured to receive the signal;
      a second circuit unit connected between the second power supply voltage and the first node, the second circuit unit configured to receive the clock signal;
      a third circuit unit connected between the first node and a ground voltage having a ground voltage level, the third circuit unit configured to receive the signal and the clock signal; and
      a fourth circuit unit configured to be driven by the second power supply voltage, to receive a signal of the first node, and to output an output signal of a second circuit area.

2. The integrated circuit of claim 1, wherein the logic circuit is configured to generate the signal to read and write from and to the memory circuit.

3. The integrated circuit of claim 1, wherein the clock signal is a signal that operates at the second power supply voltage level and the ground voltage level.

4. The integrated circuit of claim 1, wherein the memory circuit further comprises a plurality of memory cells, and an address decoder configured to decode address signals that address the plurality of memory cells and interface with the logic circuit.

5. The integrated circuit of claim 4, wherein the address decoder is configured to receive the address signals from the logic circuit, and shift levels of the address signals from the first power supply voltage level to the second power supply voltage level.

6. The integrated circuit of claim 1, wherein the memory circuit further comprises a plurality of memory cells each connected to a pair of bit-lines, a sense amplifier unit connected to the bit-lines and which is configured to sense memory cell data selected from the plurality of memory cells, and a control signal generating unit configured to generate a sensing enable signal that activates the sense amplifier unit, and interface with the logic circuit.

7. The integrated circuit of claim 6, wherein the control signal generating unit is configured to receive a read-enable signal having the first power supply voltage level from the logic circuit, and convert a level of the read-enable signal to a level of the sensing enable signal having the second power supply voltage level.

8. A decoder comprising:
a logic gate configured to decode a plurality of first input signals having a first power supply voltage level and generate a first output signal at an output node, the first output signal having a second power supply voltage level different from the first power supply voltage level; and
an inverter configured to invert the first output signal and generate a second output signal at the second power supply voltage level,
wherein the decoder is configured to receive a first clock signal configured to control precharging the output node at a first logic level of the first clock signal and evaluate the output node at a second logic level of the first clock signal, and
wherein the second output signal is received at the logic gate.

9. The decoder of claim 8, further comprising:
a latch circuit configured to operate at the first power supply voltage level, latch a plurality of second input signals and provide the plurality of first input signals with the plurality of latched second input signals.

10. The decoder of claim 9, wherein the latch circuit comprises:
a plurality of latches configured to latch the plurality of second input signals at a first logic level of a second clock signal and provide the plurality of first input signals with the plurality of latched second input signals at a second logic level of the second clock signal.

11. The decoder of claim 10, wherein the second clock signal operates at the first power supply voltage level, the first clock signal operates at the second power supply voltage level and the second clock signal is a buffered clock signal of the first clock signal.

12. The decoder of claim 8, wherein the logic gate comprises:
a first PMOS transistor connected to a second power supply voltage which supplies the second power supply voltage level, and configured to be controlled by the second output signal;
a second PMOS transistor connected between the first PMOS transistor and the output node, and configured to be controlled by the first input signals at the first power supply voltage level;
a third PMOS transistor connected to the second power supply voltage, and configured to be controlled by the first clock signal; and
first and second NMOS transistors serially connected between the output node and a ground voltage, and configured to be respectively controlled by the first input signals and the first clock signal.

13. The decoder of claim 8, wherein the logic gate comprises a transistor configured to prohibit the output node from being supplied with the second power supply voltage level when the output node is at a logic low level at the second logic level of the first clock signal.

14. A memory comprising:
an address decoder configured to decode a plurality of address input signals at a first power supply voltage level and generate a first address decoding signal at an output node at a second power supply voltage level different from the first power supply voltage level; and
an inverter configured to invert the first address decoding signal and generate a second address decoding signal at the second power supply voltage level,
wherein the memory is configured to receive a first clock signal configured to control precharging the output node at a first phase of the first clock signal and evaluate the output node at a second phase of the first clock signal, and
wherein the second address decoding signal is received at a logic gate.

15. The memory of claim 14, further comprising:
a memory array having a plurality of memory cells each of which is connected to a pair of bit-lines, a sense amplifier unit connected to the bit-lines and configured to sense memory cell data selected from the plurality of memory cells, and a control signal generating unit configured to generate a sensing enable signal that activates the sense amplifier unit, wherein the memory array is supplied with the second power supply voltage level.

16. The memory of claim 15, further comprising:
an address latch circuit configured to operate at the first power supply voltage level, latch a plurality of second input signals and provide the plurality of first input signals with the plurality of latched second input signals.

17. The memory of claim 16, wherein the address latch circuit comprises:
a plurality of latches configured to latch the plurality of second input signals at a first phase of a second clock signal and provide the plurality of first input signals with the plurality of latched second input signals at a second phase of the second clock signal.

18. The memory of claim 17, wherein the second clock signal operates at the first power supply voltage level, the first clock signal operates at the second power supply voltage level and the second clock signal is a buffered clock signal of the first clock signal.

19. The memory of claim 14, wherein the logic gate comprises
a first PMOS transistor connected to a second power supply voltage which supplies the second power supply voltage level, and configured to be controlled by a second output signal;

a second PMOS transistor connected between the first PMOS transistor and the output node, and configured to be controlled by first input signals at the first power supply voltage level;

a third PMOS transistor connected to the second power supply voltage, and configured to be controlled by the first clock signal; and first and second NMOS transistors serially connected between the first node and a ground voltage, and configured to be respectively controlled by the first input signals and the first clock signal.

20. The memory of claim 14, wherein the logic gate comprises a transistor configured to prohibit the output node from being supplied with the second power supply voltage level when the output node is at a logic low level at a second logic level of the first clock signal.

21. A method of processing data by an integrated circuit comprising a logic circuit and a memory circuit, the method comprising:

generating, by the logic circuit, control signals having a first power supply voltage level which are used to control the memory circuit, and transmitting the control signals to the memory circuit;

shifting, by the memory circuit, levels of the controls signals to a second power supply voltage level which is different from the first power supply voltage level; and performing, by the memory circuit, read or write operations according to the control signals having the shifted levels, wherein the shifting comprises driving a clocked gate comprised in the memory circuit by the second power supply voltage level such that the clocked gate generates, in response to a clock signal, an output signal to be used by the memory circuit during the shifting, wherein the method further comprises:

receiving, by an interface circuit comprised in the memory circuit, the control signals having the first power supply voltage level, supplying a first circuit unit, which is comprised in the interface circuit and connected between a second power supply voltage having the second power supply voltage level and a first node, with power at the second power supply voltage level according to the output signal of the clocked gate, receiving, by the first circuit unit, the control signals having the first power supply voltage level, receiving, by a second circuit unit which is comprised in the interface circuit and connected between the second power supply voltage and the first node, the clock signal, receiving, by a third circuit unit which is comprised in the interface circuit and connected between the first node and a ground voltage having a ground voltage level, the control signals having the first power supply voltage level and the clock signal, driving a fourth circuit unit, which is comprised in the interface circuit, by the second power supply voltage, receiving, by the fourth circuit unit, a signal of the first node, and outputting, by the fourth circuit, an output signal of a second circuit area.

22. The method of claim 21, wherein the second power supply voltage level is greater than the first power supply voltage level.

23. The method of claim 21, wherein the generating of the control signals comprises generating an address signal indicating a location of a memory to be accessed in the memory circuit, a read-enable signal indicating a read operation to be performed, and a write-enable signal indicating a write operation to be performed.

24. The method of claim 21, further comprising:

performing an address decoding operation simultaneously with the shifting when the control signals transmitted to the memory circuit comprise address signals.

* * * * *